United States Patent
Zhu et al.

(10) Patent No.: US 10,148,322 B2
(45) Date of Patent: Dec. 4, 2018

(54) DEMODULATOR OF A WIRELESS COMMUNICATION READER

(71) Applicant: Intel IP Corporation, Santa Clara, CA (US)

(72) Inventors: Jie Zhu, San Jose, CA (US); Sebastien Fievet, Cupertino, CA (US); Sathish K. Kuttan, San Jose, CA (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/088,636

(22) Filed: Apr. 1, 2016

(65) Prior Publication Data

US 2017/0288741 A1    Oct. 5, 2017

(51) Int. Cl.
*H04L 25/00* (2006.01)
*H04B 5/02* (2006.01)
(Continued)

(52) U.S. Cl.
CPC .............. *H04B 5/02* (2013.01); *H03D 1/2209* (2013.01); *H03D 1/2245* (2013.01);
(Continued)

(58) Field of Classification Search
CPC ............................ H04W 4/008; H04B 5/0056
(Continued)

(56) References Cited

U.S. PATENT DOCUMENTS 6,757,340 B1   6/2004 Jakobsson
8,188,787 B2   5/2012 Wilson et al.
(Continued)

FOREIGN PATENT DOCUMENTS

EP    0 389 974 A1    10/1990
GB    2437574 A       10/2007
WO    2008/0903254 A1  8/2008

OTHER PUBLICATIONS

Rado, Lapuh: "Phase estimation of asynchronously sampled signal using interpolated three-parameter sinewave fit technique", Instrumentation and Measurement Technology Conference (I2MTC), 2010 IEEE, IEEE, Piscataway, NJ, USA, May 3, 2010 (May 3, 2010), pp. 82-86.

(Continued)

*Primary Examiner* — Wen Huang
(74) *Attorney, Agent, or Firm* — Schiff Hardin LLP

(57) ABSTRACT

A demodulator including a peak sampler to control an ADC or a digital resampler to sample a carrier signal in an unmodulated state at peaks, and to sample the carrier signal in a modulated state at a phase of the unmodulated state; and an envelope builder to determine an envelope signal based on differentials between maximum and minimum peaks of respective cycles of the sampled carrier signal. Further, a demodulator having an offset estimator to estimate in-phase and quadrature components of a carrier signal in an unmodulated state to determine in-phase and quadrature component offsets; a load modulated signal estimator to estimate in-phase and quadrature components of a load modulated signal by removing the in-phase and quadrature component offsets from in-phase and quadrature component samples of the carrier signal; and an envelope builder to build an envelope signal by combining the in-phase and quadrature components of the load modulated signal.

33 Claims, 9 Drawing Sheets

(51) Int. Cl.
  *H04W 4/80*    (2018.01)
  *H03D 1/22*    (2006.01)
  *H04B 5/00*    (2006.01)
  *H04L 25/06*   (2006.01)
  *H04L 27/06*   (2006.01)
  *H04L 27/233*  (2006.01)

(52) U.S. Cl.
  CPC ........... *H04B 5/0031* (2013.01); *H04L 25/06* (2013.01); *H04L 27/06* (2013.01); *H04W 4/80* (2018.02); *H04L 27/2335* (2013.01)

(58) Field of Classification Search
  USPC ..................................... 455/41.1, 41.2, 41.3
  See application file for complete search history.

(56) References Cited

U.S. PATENT DOCUMENTS

| | | | |
|---|---|---|---|
| 2002/0127983 A1* | 9/2002 | Black ..................... | H04B 7/082 455/135 |
| 2003/0174079 A1 | 9/2003 | Soltanian et al. | |
| 2005/0041759 A1 | 2/2005 | Nakano | |
| 2005/0281318 A1* | 12/2005 | Neugebauer ........... | H04B 1/707 375/134 |
| 2006/0203949 A1* | 9/2006 | Minemura ....... | G11B 20/10009 375/376 |
| 2007/0026825 A1* | 2/2007 | Wilson ................. | G06K 7/0008 455/130 |
| 2008/0089391 A1 | 4/2008 | O'Shea | |
| 2008/0240294 A1* | 10/2008 | Hall ....................... | H04L 25/06 375/319 |
| 2010/0310012 A1* | 12/2010 | Hsu ......................... | H04L 27/14 375/324 |
| 2011/0096684 A1* | 4/2011 | Liao .................... | H04L 12/2801 370/252 |
| 2013/0225071 A1* | 8/2013 | Royston ............... | H04B 5/0031 455/41.1 |
| 2015/0318979 A1* | 11/2015 | Ciacci .................. | H04L 7/0276 375/358 |
| 2016/0218901 A1* | 7/2016 | Okuhata ................. | H04L 25/06 |

OTHER PUBLICATIONS

T.I. Laakso et al.: "Splitting the unit delay—tools for fractional delay filter design", IEEE Signal Processing Magazine, vol. 13, No. 1, Jan. 1, 1996 (Jan. 1, 1996), pp. 30-60.

A.Anand Kumar: "digital signal processing", Jan. 1, 2015 (Jan. 1, 2015), PHI Learning Private Limited, Delhi, p. 746, line 12-line 13.

European Extended Search Report dated Sep. 21, 2017, Application No. 17158554.0.

* cited by examiner

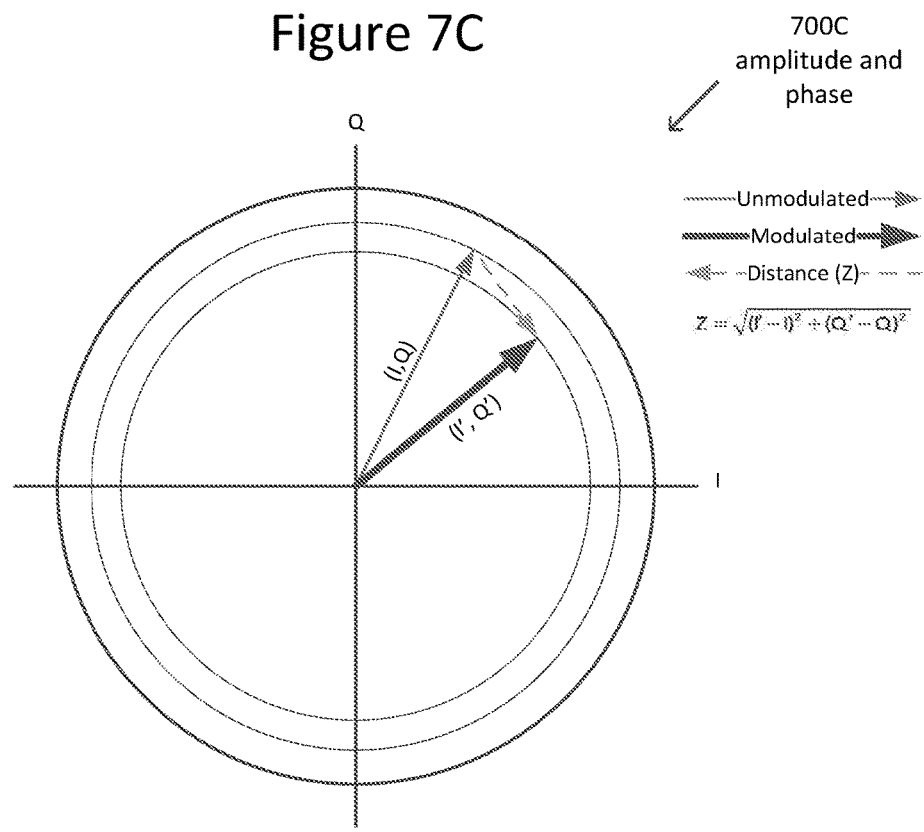
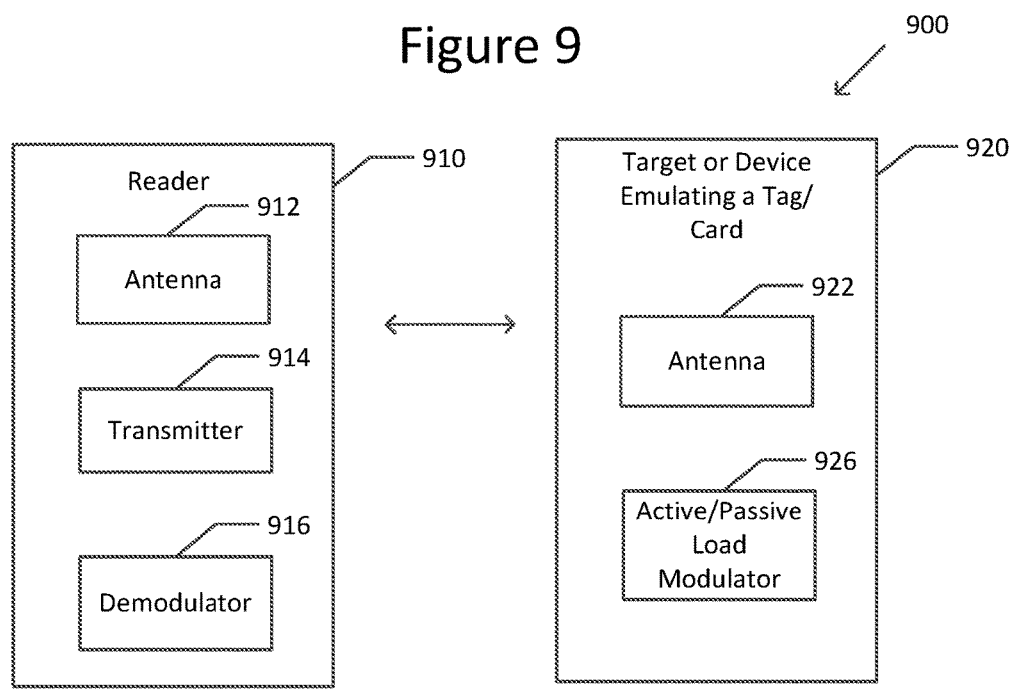

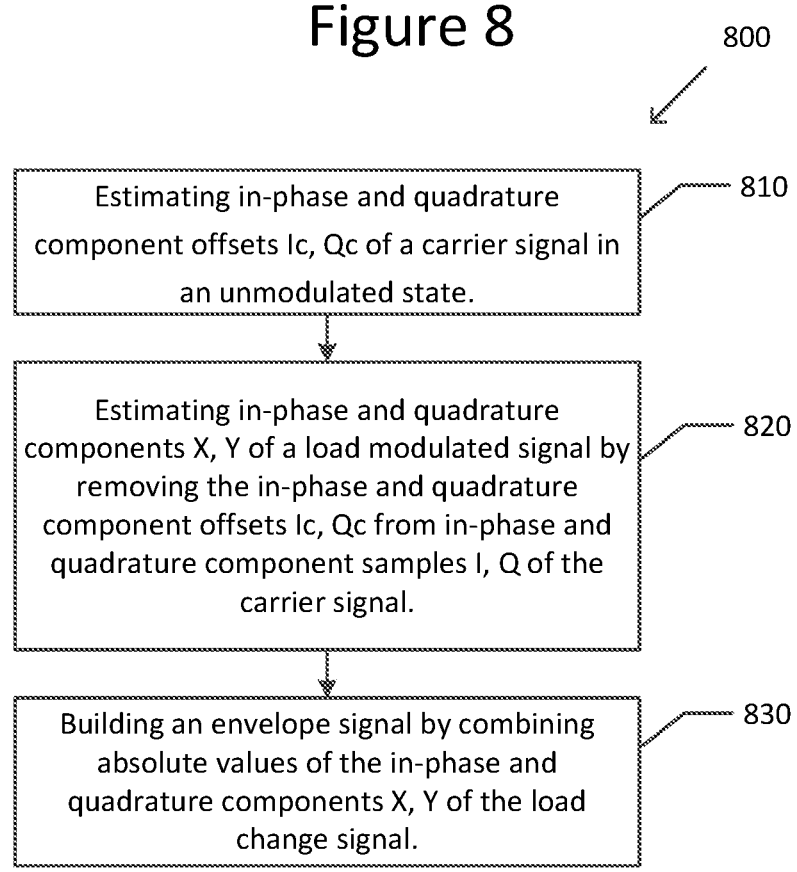

DEMODULATOR OF A WIRELESS COMMUNICATION READER

TECHNICAL FIELD

The present disclosure generally relates to a demodulator of a near field wireless communication reader, and more specifically, to a coherent demodulator configured to increase a modulation index of a modulated carrier signal artificially. The disclosure also relates to a noncoherent demodulator configured to demodulate a phase and amplitude of a load modulated signal.

BACKGROUND

A Near Field Communication (NFC) system comprises a reader and one or more targets, which may alternatively be referred to as tags, cards, NFC-enabled phones, etc.

The reader and target communicate through inductive coupling of their respective antennas using, for example, Amplitude-Shift Keying (ASK) modulation. The reader transmits an unmodulated carrier signal C(t) generally at a 13.56 MHz carrier frequency (Fc). A target receiving this carrier signal C(t) may communicate data to the reader by modulating the carrier signal with the data to generate a load modulated signal M(t). In the case of passive load modulation the target modulates the data on the carrier signal by switching between two impedance loads. In the case of active modulation, the target generates a carrier synchronized to the carrier from the reader. The amplitude and phase of the resultant modulated carrier signal CM(t) is a sum of the unmodulated carrier signal C(t) and the load modulated signal M(t).

There impedance variations translate into a carrier amplitude modulation that the reader detects. There is also a parasitic carrier phase difference between unmodulated and modulated states.

Further, there is typically an operating volume within which the communication between the reader and target is successful. However, there are typically one or more points in space within this operating volume where the load modulation amplitude is zero or near zero and not sufficient for the reader to demodulate. Such points are known as "communication holes". For example, if there is an operating volume of about 4 cm, somewhere within the 4 cm operating volume, for example, at around 2 cm, the amplitude modulation caused by the load modulation may be close to zero. This means that both below and above 2 cm there is load modulation amplitude that can be decoded, but at 2 cm the load modulation amplitude is zero.

BRIEF DESCRIPTION OF THE DRAWINGS

FIGS. 7A-7C illustrate in-phase and quadrature plots of the demodulator of FIG. 1.

FIG. 8 is a flowchart of a method of decoding in accordance with an aspect of the disclosure.

FIG. 9 illustrates a schematic diagram of a wireless system comprising a reader including a decoder and a target or device emulating a tag/card.

DESCRIPTION OF THE ASPECTS

The present disclosure is directed to a coherent demodulator of a wireless communication reader configured to leverage on a parasitic carrier signal phase change between the carrier signal's unmodulated and modulated states. More specifically, a phase of the demodulator is locked onto the unmodulated carrier signal by sampling the unmodulated carrier signal at the peaks. When the target modulates the carrier signal using Amplitude Shift Keying (ASK), the target effectively decreases the carrier signal amplitude, and the phase of the carrier signal changes due to the impedance changes affecting the transfer function. Since the phase of the demodulator is locked onto the carrier signal in the unmodulated state, a result is the carrier signal in the modulated state is sampled off-peak, thereby increasing the modulation index artificially.

Figure 1:
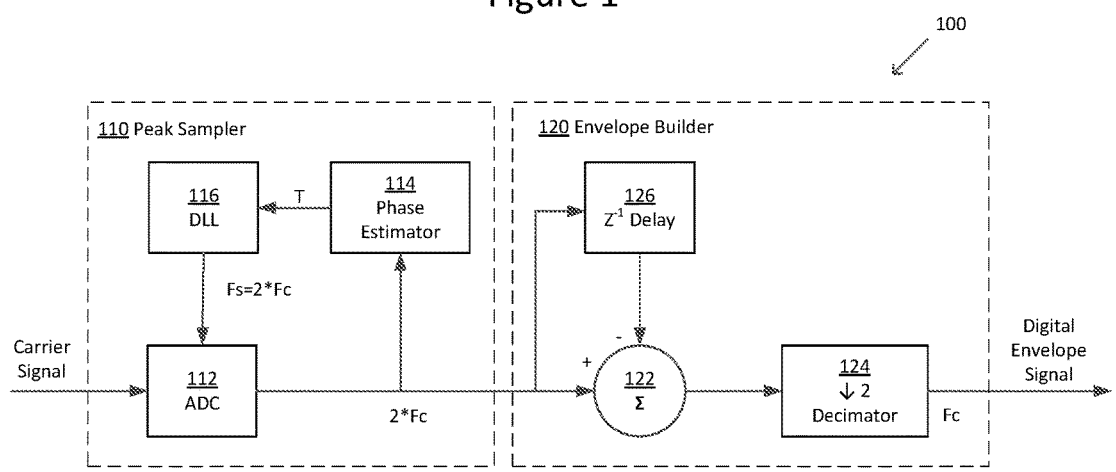
FIG. 1 illustrates a schematic diagram of a demodulator in accordance with an aspect of the disclosure.

FIG. 1 illustrates a schematic diagram of a demodulator 100 of a wireless communication reader in accordance with an aspect of the disclosure.

The demodulator 100 comprises a peak sampler 110 and an envelope builder 120.

The peak sampler 110 is configured to sample a carrier signal in an unmodulated state at peaks, and to sample the carrier signal in a modulated state at a sampling phase of the unmodulated state, thus off-peak. The peak sampler 110 comprises an analog-to-digital converter (ADC) 112, a phase estimator 114, and a digital delay lock loop (DLL).

The ADC 112 is configured to receive at its input a carrier signal and sample the carrier signal at a sampling frequency Fs that is at least twice the carrier frequency Fc so as to satisfy the Nyquist theorem. As there are two peaks in a carrier cycle, ideally these two samples have the same amplitude but different sign. This sampling of the carrier signal occurs during both unmodulated and modulated states.

The phase estimator 114 has an input coupled to an output of the ADC 112. The phase estimator 114 is configured to estimate the phase of the carrier signal in the unmodulated state for a predetermined period of time following the wireless communication reader establishing a communication session with a wireless target. This predetermined period of time may be few microseconds, which is perhaps less than 100 samples, depending on the particular phase loop control algorithm. The demodulator 100 then uses the phase estimate T to set the sampling clock phase stage of the unmodulated carrier signal. The phase estimator 114 does not continue estimating the phase of the carrier signal when the carrier signal is subsequently in the modulated state. However, the phase estimator 114 might continue estimating the phase of the carrier signal when the carrier is in any subsequent unmodulated states if the unmodulated state information can be fed back from a consequent bit-detector or known bits.

The DLL 116 has an input coupled to an output of the phase estimator 114 and an output coupled to a second input of the ADC 112. The DLL 116 is configured to use the phase information T from the phase estimator 114 to control the ADC 112 to sample the carrier signal in an unmodulated state at peaks, and to sample the carrier signal in a modulated state at the phase of carrier signal in the unmodulated state. Since during the modulated state the phase of the carrier signal changes due to the impedance changes affecting the transfer function, during the modulated state the carrier signal is sampled off-peak. A difference between the phases of the carrier signal in the unmodulated state and the modulated state is nonzero and could be up to π/2 depending upon the impedance changes.

The envelope builder 120 has an input coupled to an output of the peak sampler 210, and is configured to determine an envelope signal based on differentials between maximum and minimum peaks of respective cycles of the sampled carrier signal. The envelope builder 120 comprises an adder 122, a decimator 124, and a delay 126.

The delay 126 has an input coupled to the output of the peak sampler 110. The output of the peak sampler in these examples also the output of the ADC 112 in FIG. 1 and the decimator 218 in FIG. 2. The delay 126 is configured to delay one sample of the carrier signal.

The adder 122 has a positive input coupled to the output of the peak sampler 110 and a negative input coupled to an output of the delay 120. The adder 122 is configured to subtract the delayed samples of the carrier signal from non-delayed samples of the carrier signal.

The decimator 124 has an input coupled to an output of the adder 122. The decimator 124 is configured to reduce the sampling rate of the carrier signal to Fc by choosing one of two samples, and its output is a digital envelope signal.

Figure 2:
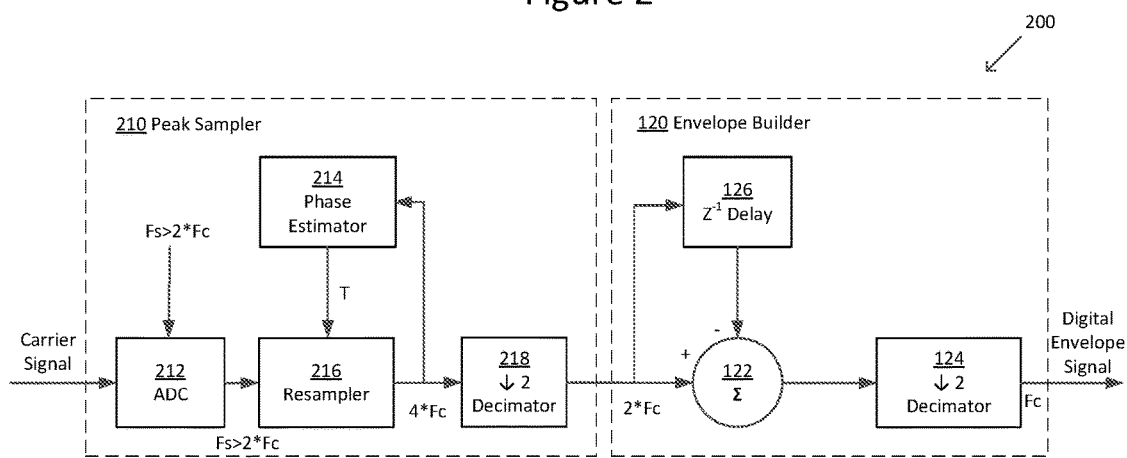
FIG. 2 illustrates a schematic diagram of a demodulator in accordance with another aspect of the disclosure.

FIG. 2 illustrates a schematic diagram of a demodulator 200 in accordance with another aspect of the disclosure.

The demodulator 200 comprises a peak sampler 210 and an envelope builder 120. The peak sampler 210 comprises an ADC 212, a phase estimator 241, a resampler 216, and a decimator 218.

The demodulator 200 differs from the demodulator 100 of FIG. 1 in its peak sampler 210. Rather than using the output of the phase estimator 114 as a reference to control the ADC 112, the output of the phase estimator 214 drives a resampler 216 to reconstruct a digitized carrier signal.

The ADC 212 is configured to receive a carrier signal and sample the carrier signal at a sampling frequency (Fs) that is at least twice the carrier frequency (2*Fc) so as to satisfy the Nyquist theorem. In this example the resampler rate is 4*Fc, which is the most simple example. The disclosure is not limited to this sampling frequency Fs=4*Fc; other sampling frequencies are possible.

The phase estimator 214 has an input coupled to an output of the ADC 212 via the resampler 216. The phase estimator 214 is configured to estimate the phase of the carrier signal in the unmodulated state. This estimation occurs for a predetermined period of time following the wireless communication reader comprising the demodulator 200 establishing a communication session with a target, as described above, and then the sampling phase to sample on the peaks of the unmodulated carrier signal is fixed.

The resampler 216 has a first input coupled to the output of the ADC 212, a second input coupled to an output of the phase estimator 214, and an output coupled to an input of the phase estimator 214. The resampler 216 is configured to use the estimated phase T from the phase estimator 214 to reconstruct the peaks of the modulated carrier signal from actual carrier signal samples using interpolation. The resampler 216 is used to reconstruct the carrier signal rather than the ADC 212 sampling at a higher rate because in some cases it is not possible to control the ADC clock.

The resampler output is represented by the following equation:

$$y(k)=A*\cos(k\pi/2+\phi) \quad \text{(Equation 1)}$$

where A is the carrier signal amplitude, k is a sampling index, and $\phi$ is a sampling phase.

When the sampling index is even (2k), the resampler output is represented by the following equation:

$$y(2k)=(-1)^k A*\cos(\phi) \quad \text{(Equation 2)}$$

When the sampling index is odd (2k+1), the resampler output is represented by the following equation:

$$y(2k+1)=(-1)^k A*\sin(\phi) \quad \text{(Equation 3)}$$

If $\phi=0$, then $y(2k)=(-1)^k A$, which are samples at carrier peaks and y(2k+1)=0. If $\phi>0$, then y(4k+1)>0 and y(4k+3)<0. If $\phi<0$, then y(4k+1)<0 and y(4k+3)>0.

The updated phase is represented by the following equation:

$$\phi[k+1]=\phi[k]+\mu*\text{sign}(G(\phi)) \quad \text{(Equation 4)}$$

where $\phi[k]$ is output of phase estimator, which is ideally 0 indicating the sample is on the peak. Again, $G(\phi)$ is a cost function that is kept as small as possible. $G(\phi)$ is a monotonous function, and thus the convergence speed of the updated phase is fast. The estimated phase is obtained at worst within 0.25/μ carrier cycles, and the maximum phase error is less than μ/2.

A cost function is represented by the following equation:

$$G(\phi)=y(4k+1)-y(4k+3)=2A\sin(\phi) \quad \text{(Equation 5)}$$

When $\phi$ is in $[-\pi/4, \pi/4]$, $G(\phi)$ is monotonous function. The resampler 216 aims to correct the sampling phase $\phi$ by minimizing the absolute value of $G(\phi)$. The adjustment may be achieved by $\mu*\text{sign}(G(\phi))$ where μ is step size and will control the error of estimated phase $\phi$ and convergence speed. 0<μ<1, for example μ=0.01.

The decimator 218 has an input coupled to the output of the resampler 216. The decimator 218 is configured to reduce the rate of the sampled carrier signal from 4*Fc to 2*Fc. The outputs of the decimator 218 are those samples of the carrier signal at positive and negative peaks.

The envelope detector 120 of FIG. 2 is that same as that of FIG. 1 described above.

In the peak sampler 210 of FIG. 2 there are samples for each cycle, a maximum/positive sample and a minimum/negative sample. The ADC 212 samples the carrier signal at a sampling frequency that is two times the carrier frequency (2*Fc), as opposed to four times the carrier frequency (4*Fc) as in previous solutions. The envelope builder 120 is configured to determine the difference between maximum and minimum to obtain a peak difference for one cycle, and this is the envelope. For two input samples (2*Fc) there is one output sample (1*Fc), which is the digital envelope signal that is sent to the bit detector (not shown). This slower output signal stream reduces a processing load of subsequent data detection by a factor of two.

Figure 3:
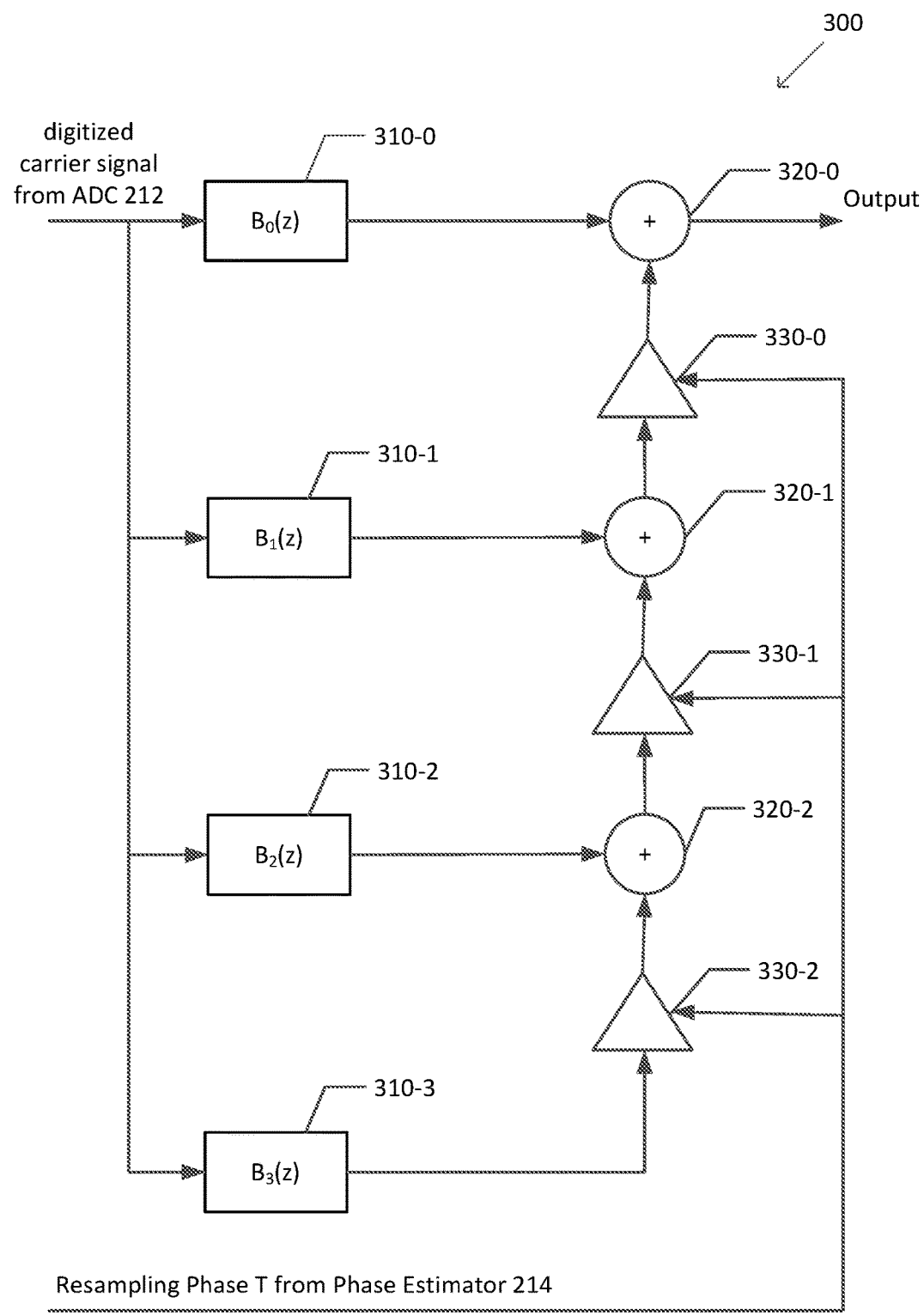
FIG. 3 illustrates a schematic diagram of a resampler of the demodulator of FIG. 2.

FIG. 3 illustrates a schematic diagram of an example of a resampler 300 (216 in FIG. 2) of the demodulator of FIG. 2.

The resampler 300 comprises a transfer function 310, adders 320, and coefficients 330. The transfer function is comprised of four transfer function units 310—$B_0(z)$, $B_1(z)$, $B_2(z)$, and $B_3(z)$—because the resampler 300 is of the fourth order.

Outputs of the transfer units B(z) 310 are combined with coefficients depending on the phase estimate T from the phase estimator 314. More specifically, the transfer units $B_n(z)$ 310-0 are configured to receive a digitized carrier signal from the ADC 212. An output of the fourth order transfer unit $B_3(z)$ 410-3 is weighted by coefficient 330-2. An output of the third order transfer unit $B_2(z)$ 310-2 is added to the weighted output of the fourth order transfer unit $B_3(z)$ 310-3, and this combined signal is weighted by coefficient 330-1. An output of the second order transfer unit $B_1(z)$ 310-1 is added to the weighted output of coefficient 330-1, and this combined signal is weighted by coefficient 330-0. An output of the first order transfer unit $B_0(z)$ 310-0 is added to the weighted output of coefficient 330-0, and this combined signal is output as the resampler output.

Figure 4A:
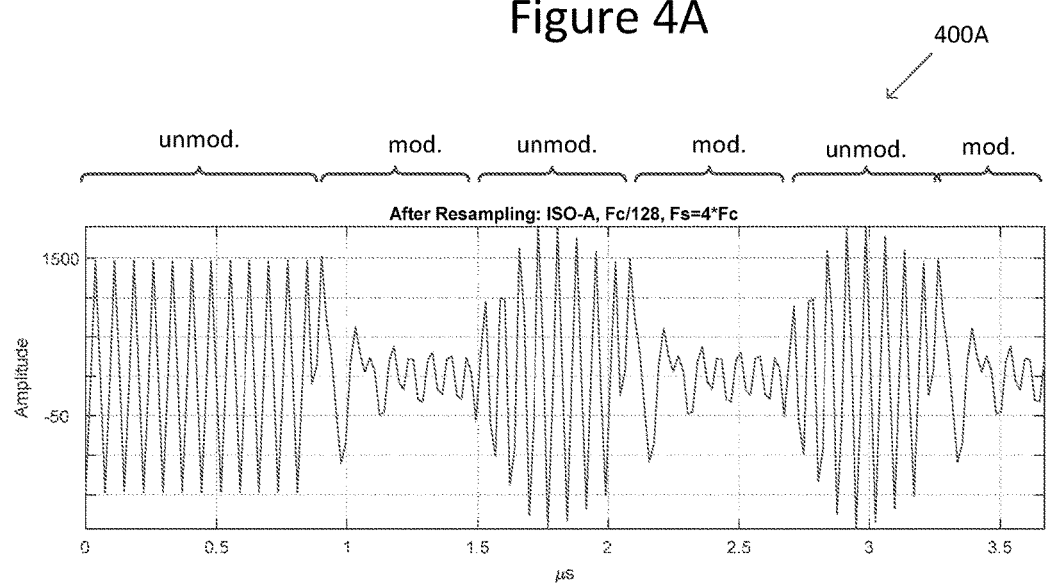
FIG. 4A illustrates a graph of an output of a resampler of the demodulator of FIG. 2.

FIG. 4A illustrates a graph 400A of an output of a resampler 216 of the demodulator 200 of FIG. 2. The graph 400A is amplitude versus samples. The carrier signal starts unmodulated, is then modulated, and then unmodulated, etc. The initial unmodulated portion is prior to the reader and target establishing a communication session, and thus is in steady state. The second unmodulated portion is higher than the first unmodulated portion due to a transient overshoot. If the communication system has enough time to settle down after modulation, the system will eventually return back to steady state.

The unmodulated carrier signal is shown in the graph 400A as varying between approximately +1500 and −1500, for a total range of approximately 3000 sampling on the positive and negative peaks. The modulated amplitude peak is about 25% of the unmodulated amplitude peak, varying between approximately +250 and −250. When sampling during modulation, due to a parasitic phase shift the samples will be off-peak and thus much less than the +250 and −250, even the signs of samples flip, depending on how off far off-peak the modulated carrier signal is sampled.

Figure 4B:
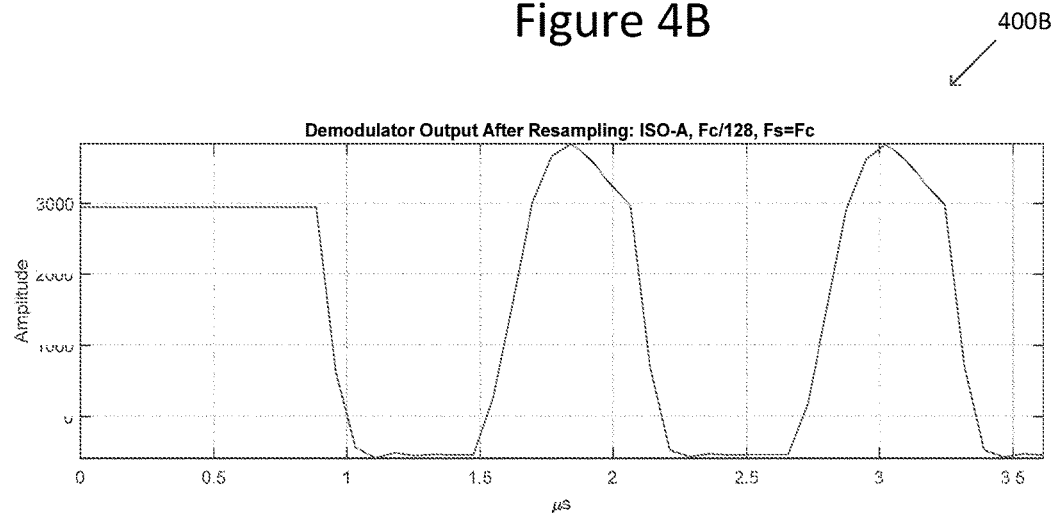
FIG. 4B illustrates a graph of an output of the demodulator of FIG. 1 or FIG. 2.

FIG. 4B illustrates the demodulator output signal of the carrier signal in graph 400A. The graph 400B is amplitude versus samples. As explained above, the unmodulated amplitude is about 3000. However, the modulated amplitude is about −500. The phase change in modulated carrier causes the signs of the samples flip. Thus the difference in amplitude between the unmodulated and modulated samples is increased artificially. The difference will not be 3000−500=2500, but will instead be 3000−(−500)=3500, for example. This increase in amplitude difference provides additional information for more accurate decoding.

Figure 5:
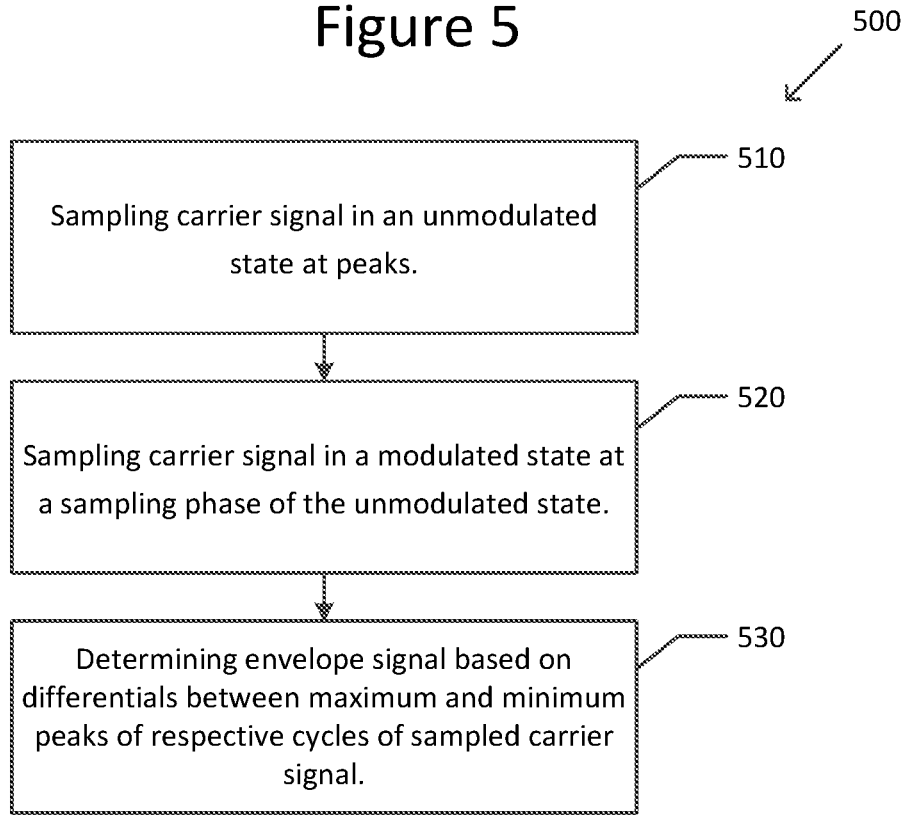
FIG. 5 is a flowchart of a method of decoding in accordance with an aspect of the disclosure.

FIG. 5 is a flowchart 500 illustrating an example of a method of decoding in accordance with an aspect of the disclosure.

At Step 510, the peak sampler 110/210 controls the ADC 112/212 or digital resampler 216 to sample a carrier signal in an unmodulated state at peaks.

At Step 520, the peak sampler 110/210 controls the ADC 112/212 or digital resampler 216 to sample the carrier signal in a modulated state at a sampling phase of the unmodulated state.

At Step 530, the envelope builder 120 determines an envelope signal based on differentials between maximum and minimum peaks of respective cycles of the sampled carrier signal.

The demodulators 100, 200 leverage on the phase shift caused by the inherent properties of load modulation. There will be a performance improvement. However, the improvement will vary with the loads, antennas and distance between the NFC target and reader. Also, implementation cost is lower.

The present disclosure is also directed to a noncoherent demodulator configured to demodulate the phase and amplitude of a load modulated signal. Thus rather than demodulating the envelope of a modulated carrier signal, the demodulator of this disclosure separates the load modulated signal from the unmodulated carrier signal, and the demodulator outputs an absolute value of the load modulated signal. Since both amplitude and phase of the dynamics of the load modulated contributes to the demodulator output, the bit detector coupled with the demodulator has better sensitivity even when the amplitude of load modulation is below the receiver's amplitude sensitivity.

Figure 6:
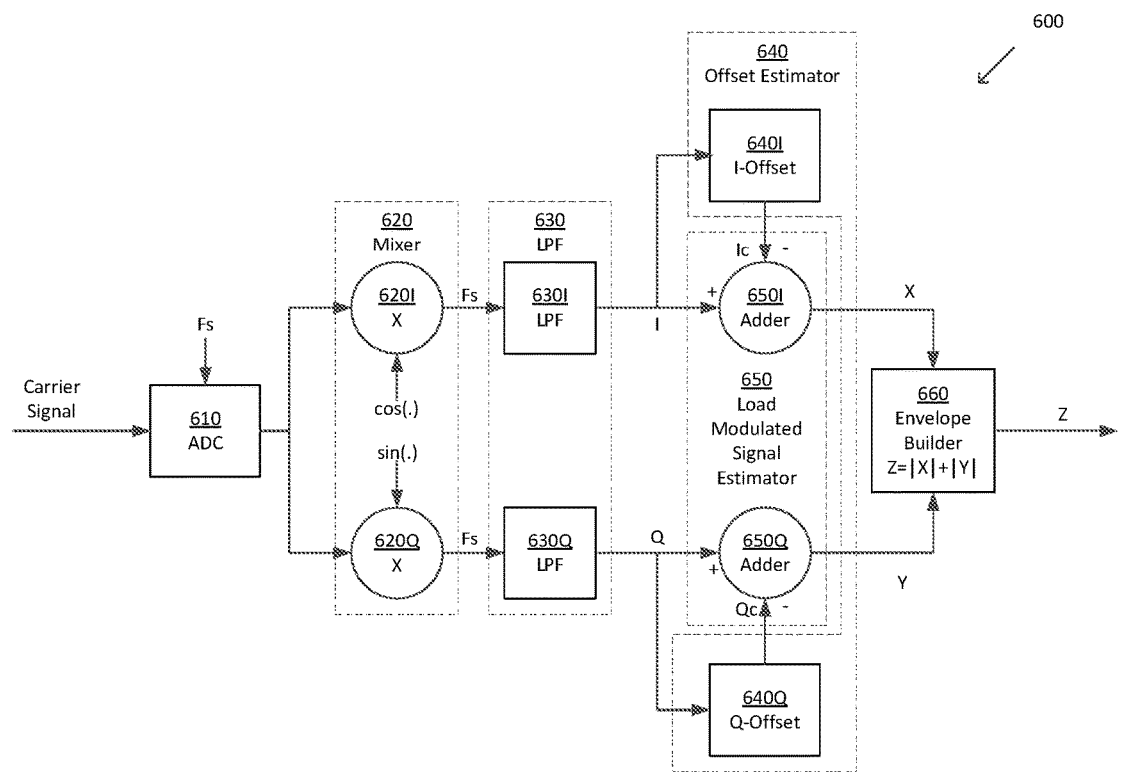
FIG. 6 illustrates a schematic diagram of a demodulator in accordance with an aspect of the disclosure.

FIG. 6 illustrates a schematic diagram of a demodulator 600 in accordance with an aspect of the disclosure.

The demodulator 600 comprises an analog-to-digital converter (ADC) 610, a pair of mixers 620, a pair of low-pass filters (LPF) 630, an offset estimator 640, a load modulated signal estimator 650, and an envelope builder 660.

The ADC 610 is configured to sample a carrier signal at a sampling frequency Fs. The sampling frequency Fs is greater than twice the carrier frequency (2*Fc) to satisfy the Nyquist theorem.

The mixer 620 is coupled to the output of the ADC 610, and has two paths to determine the in-phase and quadrature components of the sampled carrier signal. The mixer frequency in this example is the carrier frequency Fc. The mixer 620 comprises an in-phase component mixer 620I configured to mix the samples of the carrier signal with a cosine function, and a quadrature component mixer 620Q configured to mix the samples of the carrier signal with a sine function.

The LPF 630 is coupled to the output of the mixer 620, and is configured to filter out frequency components greater than a predetermined frequency (e.g. 2*Fc) from the mixed in-phase and quadrature components of the carrier signal and output the in-phase component signal 1 and the quadrature component signal Q. The LPF 630 comprises an in-phase component low-pass filter 630I configured to filter out frequency components from the mixed in-phase component of the carrier signal, and a quadrature component low-pass filter 630Q configured to filter out frequency components from the mixed quadrature component of the carrier signal.

The offset estimator 640 is coupled to the output of the LPF 630, and is configured to estimate in-phase and quadrature components of the carrier signal when the carrier signal is in an unmodulated state to determine in-phase and quadrature component offsets. The offset estimator 640 comprises an in-phase offset estimator 640I configured to estimate the in-phase component offset Ic of the carrier signal in the unmodulated state by averaging in-phase component samples of the carrier signal in the unmodulated state. The offset estimator 640 also comprises a quadrature offset estimator 640Q configured to estimate the quadrature component offset Qc of the carrier signal in the unmodulated state by averaging quadrature component samples of the carrier signal in the unmodulated state. The number of samples of the carrier signal averaged by each of the in-phase offset estimator 640I and the quadrature offset estimator 640Q may be, for example, 256 samples. Each of the offsets Ic, Qc is a sum of samples divided by the number of samples. Averages of the carrier signal samples are used as offsets so as to reduce noise impact. If the signal-to-noise ratio is high, for example, higher than 40 dB, no averaging is needed. In practice, the offset may be a moving average or a mean of a number of samples.

The offset estimator 640 is configured to estimate the in-phase and quadrature components Ic, Qc of the carrier signal in the unmodulated state for a predetermined period of time following the wireless communication reader establishing a communication session with a wireless tag. When the reader and tag start communicating, it will take some time before the tag starts to modulate the carrier signal. At the beginning of the communication session the in-phase and quadrature component offsets Ic, Qc are determined, then these offsets are fixed for the modulated state. The mode when the offset estimator 630 updates the in-phase and quadrature component offsets may be controlled by firmware when the timing of the unmodulated signal state is known.

The load modulated signal estimator 650 is configured to estimate in-phase and quadrature components X, Y of a load modulated signal by removing the in-phase and quadrature component offsets Ic, Qc from in-phase and quadrature component samples I, Q of the carrier signal. The load modulated signal estimator 650 comprises an in-phase component load modulated signal 6501 and a quadrature component load modulated signal estimator 650Q.

The in-phase component load modulated signal estimator 6501 has a positive input coupled to an output of the in-phase component LPF 6301 and a negative input coupled to an output of the in-phase offset estimator 6401. The in-phase component load modulated signal estimator 6501 is configured to remove the in-phase component offset Ic of the carrier signal in the unmodulated state from the in-phase component samples I of the carrier signal. For every sample of the in-phase component I of the carrier signal, the in-phase component X of the load modulated signal is represented in accordance with the following equation:

$$X = I - Ic \qquad \text{(Equation 6)}$$

where X is the in-phase component of the load modulated signal, I is an in-phase sample of the carrier signal, and Ic is the in-phase component offset.

The quadrature component load modulated signal estimator 650Q has a positive input coupled to an output of the quadrature component LPF 630Q and a negative input coupled to the output of the quadrature offset estimator 640Q. The quadrature component load modulated signal estimator 650Q is configured to remove the quadrature component offset Qc of the carrier signal in the unmodulated state from the quadrature component samples Q of the carrier signal. For every sample of the quadrature component Q sample of the carrier signal, the quadrature phase component Y of the load modulated signal is determined in accordance with the following equation:

$$Y = Q - Qc \qquad \text{(Equation 7)}$$

where Y is the quadrature component of the load modulated signal, Q is a quadrature sample of the carrier signal, and Qc is the quadrature component offset.

The envelope builder 660 is coupled to the output of the load modulated signal estimator 650, and is configured to build an envelope signal Z by combining X and Y signals. For example, Z may be the sum of the square of X and the square of Y. In the sequel, Z is the sum of absolute values of the in-phase X and quadrature component Y outputs of the load modulated signal. The envelope signal is represented by the following formula:

$$Z = |X| + |Y| \qquad \text{(Equation 8)}$$

where Z is the envelope signal, |X| is the absolute value of the in-phase component of the load modulated signal, and |Y| is the absolute value of the quadrature component of the load modulated signal. When the carrier signal is unmodulated, the envelope signal Z will be zero, and when the carrier signal is modulated, the envelope signal will not be zero. The envelope signal Z is then sent to a bit detector (not shown).

Alternatively, The envelope signal is represented by the following formula:

$$Z = \sqrt{X^2 + Y^2} \qquad \text{(Equation 9)}$$

Either of Equations 8 and 9 works and provides a same result, but Equation 8 is easier and less expensive to implement.

Figure 7A:
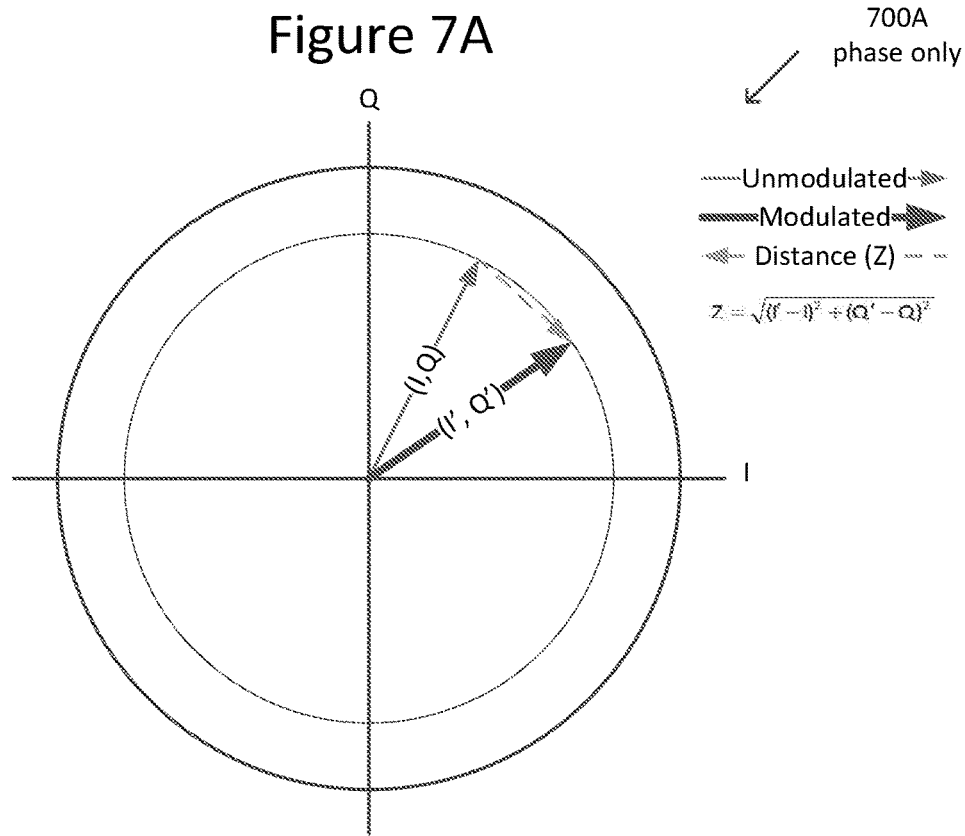
Figure 7B:
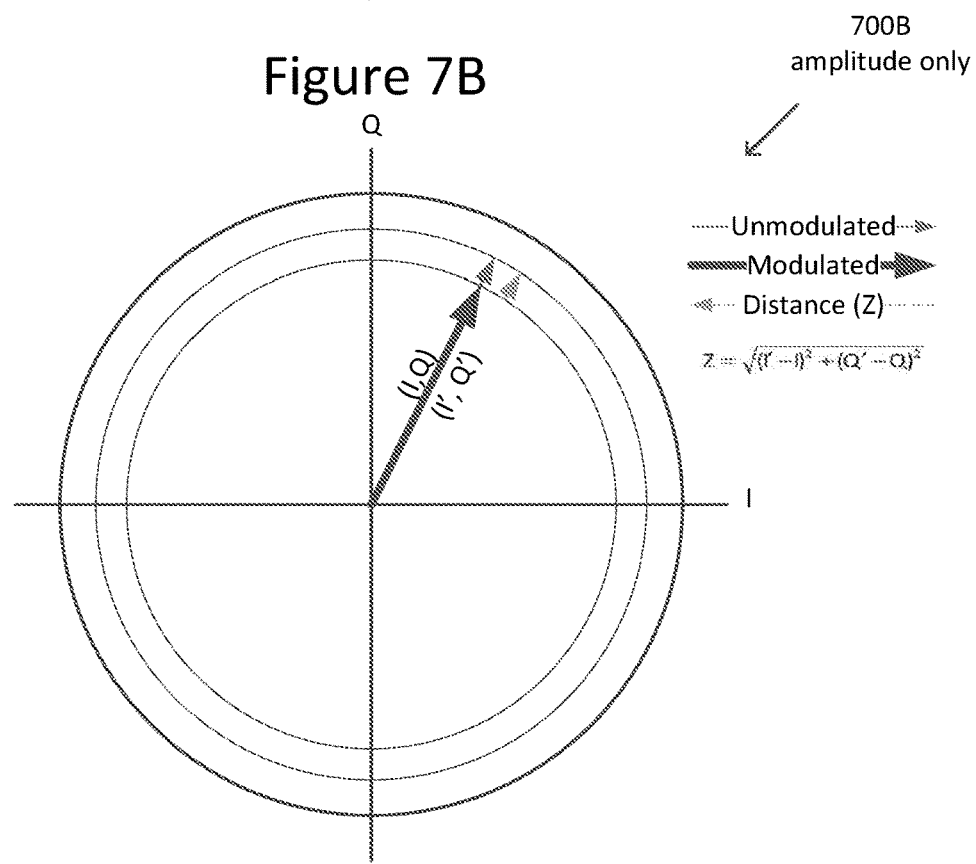

FIGS. 7A-7C illustrate in-phase and quadrature plots 700 of the demodulator 600 of FIG. 6. Modulation information may be obtained by looking for a difference between the unmodulated carrier signal and the modulated carrier signal, and the difference could be in amplitude, phase, or both. There is no need for a decision mechanism for looking at the amplitude separately, phase separately, and then determine which is used.

Each of the plots 700 illustrates an unmodulated carrier signal (I,Q) with a thin line, a modulated carrier signal (I',Q') with a bold line, and a load modulated signal representing the difference between the unmodulated and modulated carrier signals with a dashed line. FIG. 7A illustrates a plot 700A of a difference in carrier signal phase only (i.e., pure PSK modulation), such as in the communication hole discussed above. FIG. 7B illustrates a plot 700B of a difference in carrier signal amplitude only (i.e., pure ASK modulation). FIG. 7C illustrates a plot 700C of a difference in both carrier signal amplitude and phase.

FIG. 8 is a flowchart 800 of a method of decoding in accordance with an aspect of the disclosure.

At Step 810, the offset estimator estimates in-phase and quadrature component offsets Ic, Qc of a carrier signal in an unmodulated state.

At Step 820, the load modulated signal estimator 650 estimates in-phase and quadrature components X, Y of a load modulated signal by removing the in-phase and quadrature component offsets Ic, Qc from in-phase and quadrature component samples I, Q of the carrier signal.

At Step 830, the envelope builder 660 builds an envelope signal by combining absolute values of the in-phase and quadrature components X, Y of the load modulated signal.

The demodulator 600 is advantageous over prior demodulators in that phase information is included more simply in the input samples to the bit detector, while the demodulator 600 remains low in cost. The demodulator 600 also demodulates carrier signals with small or zero amplitude load modulation indices, that is, during communication holes.

The demodulator 600 also reduces a dynamic range needed for the bit detector. Since the demodulator uses a difference between the unmodulated and modulated carrier signals, and the phase difference is typically below $\pi/4$, the demodulator 600 is not processing absolute signal values, and thus there can be a much lower dynamic range as compared with previous demodulators.

FIG. 9 illustrates a schematic diagram of a wireless system 900.

The wireless communication system 900 is a Near Field Communication (NFC) system, though the disclosure is not limited in this respect. The wireless communication system 900 may be any short range (e.g., a few centimeters) communication (e.g., NFC) involving antenna coupling.

The wireless communication system 900 comprises a reader 910 and a target or device emulating a tag/card 920. The reader 910 comprises an antenna 912, a transmitter 914, and a demodulator 916, as well as other well-known components. The demodulator 914 is one of the demodulators described above with respect to FIGS. 1, 2, and 6. The target or device emulating a tag/card 920 comprises an antenna 922 and an active/passive load modulator 926, along with other well-known components, and is configured to communicate with the reader 910 by modulating the carrier signal with data. The data may be modulated on the carrier signal using Amplitude Shift Keying (ASK) by switching the load impedances, though the disclosure is not limited in this respect. The tag or device emulating a tag/card 920 may use any modulating technique as suitable for the intended purpose.

Example 1 is a demodulator of a wireless communication reader, comprising: a peak sampler configured to sample a carrier signal in an unmodulated state at peaks, and to sample the carrier signal in a modulated state at a phase of the unmodulated state; and an envelope builder having an input coupled to an output of the peak sampler, and configured to determine an envelope signal based on differentials between maximum and minimum peaks of respective cycles of the sampled carrier signal.

In Example 2, the subject matter of Example 1, wherein the peak sampler comprises: an analog-to-digital converter having an input configured to receive the carrier signal; and a phase estimator having an input coupled to an output of an analog-to-digital converter, and configured to estimate the phase of the carrier signal in the unmodulated state.

In Example 3, the subject matter of Example 2, wherein the phase estimator is configured to estimate the phase of the carrier signal in the unmodulated state for a predetermined period of time.

In Example 4, the subject matter of Example 3, wherein the phase estimator is configured to estimate the phase of the carrier signal in the unmodulated state for a predetermined period of time following the wireless communication reader establishing a communication session with a wireless target.

In Example 5, the subject matter of Example 2, wherein the peak sampler further comprises: a delay lock loop (DLL) having an input coupled to an output of the phase estimator and output coupled to a second input of the analog-to-digital converter, and configured to control the analog-to-digital converter to sample the carrier signal in both the unmodulated and modulated states at the phase of the carrier signal in the unmodulated state.

In Example 6, the subject matter of Example 2, wherein the peak sampler further comprises: a resampler having a first input coupled to the output of the analog-to-digital converter, a second input coupled to an output of the phase estimator, and an output coupled to an input of the phase estimator, and configured to interpolate the samples of the carrier signal to sample the carrier signal in the unmodulated state at the peaks.

In Example 7, the subject matter of Example 6, wherein the peak sampler further comprises: a decimator having an input coupled to the output of the resampler, and configured to reduce the sampling rate of the carrier signal.

In Example 8, the subject matter of Example 1, wherein the envelope builder comprises: a delay having an input coupled to the output of the peak sampler, and configured to delay samples of the carrier signal; and an adder having a positive input coupled to the output of the peak sampler and a negative input coupled to an output of the delay, and configured to subtract the delayed samples of the carrier signal from non-delayed samples of the carrier signal.

In Example 9, the subject matter of Example 8, wherein the envelope builder further comprises: a decimator having an input coupled to an output of the adder, and configured to reduce the sampling rate of the carrier signal.

In Example 10, the subject matter of Example 1, wherein the wireless communication reader is a Near Field Communication (NFC) reader.

In Example 11, the subject matter of Example 1, wherein the carrier signal in the modulated state is Amplitude Shift Keying (ASK) modulated.

Example 12 is a wireless communication system, comprising: the wireless communication reader comprising the demodulator of the subject matter of Example 1; and at least one wireless target configured to communicate with the wireless communication reader by modulating the carrier signal with data.

In Example 13, the subject matter of Example 12, wherein the wireless communication system is a Near Field Communication (NFC) system.

Example 14 is a method for demodulating in a wireless communication reader, comprising: sampling, by a peak sampler, a carrier signal in an unmodulated state at peaks, and the carrier signal in a modulated state at a phase of the unmodulated state; and determining, by an envelope builder, an envelope signal based on differentials between maximum and minimum peaks of respective cycles of the sampled carrier signal.

In Example 15, the subject matter of Example 14, further comprising: estimating, by a phase estimator, the phase of the carrier signal in the unmodulated state.

In Example 16, the subject matter of Example 15, further comprising: controlling, by a delay lock loop (DLL), an analog-to-digital converter to sample the carrier signal in both the unmodulated and modulated states at the phase of the carrier signal in the unmodulated state.

In Example 17, the subject matter of Example 15, further comprising: interpolating, by a resampler, samples of the carrier signal to sample the carrier signal in an unmodulated state at the peaks.

In Example 18, the subject matter of Example 17, further comprising: decimating, by a decimator, the sampling rate of the interpolated carrier signal.

In Example 19, the subject matter of Example 14, further comprising: estimating, by the phase estimator, the phase of the carrier signal in the unmodulated state for a predetermined period of time.

In Example 20, the subject matter of Example 19, further comprising: estimating, by the phase estimator, the phase of the carrier signal in the unmodulated state for a predetermined period of time following the wireless communication reader establishing a communication session with a wireless target.

In Example 21, the subject matter of Example 14, further comprising: delaying, by a delay, samples of the carrier signal; and subtracting, by an adder, the delayed samples of the carrier signal from non-delayed samples of the carrier signal.

In Example 22, the subject matter of Example 21, further comprising: decimating, by a decimator, the sampling rate of the carrier signal.

Example 23 is a demodulator in a wireless communication reader, comprising: an offset estimator configured to estimate in-phase and quadrature components offsets of a carrier signal in an unmodulated state to determine in-phase and quadrature component offsets; a load modulated signal estimator configured to estimate in-phase and quadrature components of a load modulated signal by removing the in-phase and quadrature component offsets from in-phase and quadrature component samples of the carrier signal; and an envelope builder, coupled to the output of the load modulated signal estimator, and configured to build an envelope signal by combining the in-phase and quadrature components of the load modulated signal.

In Example 24, the subject matter of Example 23, wherein the offset estimator comprises: an in-phase offset estimator configured to estimate the in-phase component offset of the carrier signal in the unmodulated state; and a quadrature offset estimator configured to estimate the quadrature component offset of the carrier signal in the unmodulated state.

In Example 25, the subject matter of Example 24, wherein the in-phase offset estimator is further configured to average in-phase component samples of the carrier signal in the unmodulated state, and wherein the quadrature offset estimator is further configured to average quadrature component samples of the carrier signal in the unmodulated state.

In Example 26, the subject matter of Example 23, wherein the load modulated signal estimator comprises: an in-phase component load modulated signal estimator configured to remove the in-phase component offset of the carrier signal in the unmodulated state from the in-phase component samples of the carrier signal; and a quadrature component load modulated signal estimator configured to remove the quadrature component offset of the carrier signal in the unmodulated state from the quadrature component samples of the carrier signal.

In Example 27, the subject matter of Example 23, wherein the offset estimator is configured to estimate the in-phase and quadrature component offsets of the carrier signal in the unmodulated state for a predetermined period of time.

In Example 28, the subject matter of Example 27, wherein the offset estimator is configured to estimate the in-phase and quadrature component offsets of the carrier signal in the unmodulated state for a predetermined period of time following the wireless communication reader establishing a communication session with a wireless tag.

Example 29 is a wireless communication system, comprising: the wireless communication reader comprising the demodulator of the subject matter of Example 23; and at least one wireless tag configured to communication with the wireless communication reader by modulating the carrier signal with data.

Example 30 is a method for demodulating in a wireless communication reader, comprising: estimating, by an offset estimator, in-phase and quadrature component offsets of a carrier signal in an unmodulated state to determine in-phase and quadrature component offsets; estimating, by a load modulated signal estimator, an in-phase and quadrature components of a load modulated signal by removing the in-phase and quadrature component offsets from in-phase and quadrature component samples of the carrier signal; and building, by an envelope builder, an envelope signal by combining absolute values of the in-phase and quadrature components of the load modulated signal.

In Example 31, the subject matter of Example 30, wherein the offset estimating step comprises: averaging in-phase component samples of the carrier signal in the unmodulated state, and averaging quadrature component samples of the carrier signal in the unmodulated state.

In Example 32, the subject matter of Example 30, wherein the offset estimating step is performed for a predetermined period of time.

In Example 33, the subject matter of Example 32, wherein the offset estimating step is performed for a predetermined period of time following the wireless communication reader establishing a communication session with a wireless tag.

Example 34 a demodulator of a wireless communication reader, comprising: a peak sampling means for sampling a carrier signal in an unmodulated state at peaks, and for sampling the carrier signal in a modulated state at a phase of the unmodulated state; and an envelope building means having an input coupled to an output of the peak sampling means, for determining an envelope signal based on differentials between maximum and minimum peaks of respective cycles of the sampled carrier signal.

In Example 35, the subject matter of Example 34, wherein the peak sampler comprises: an analog-to-digital converting means having an input for receiving the carrier signal; and a phase estimating means having an input coupled to an output of an analog-to-digital converting means, and for estimating the phase of the carrier signal in the unmodulated state.

In Example 36, the subject matter of Example 35, wherein the phase estimating means is for estimating the phase of the carrier signal in the unmodulated state for a predetermined period of time.

In Example 37, the subject matter of Example 36, wherein the phase estimating means is for estimating the phase of the carrier signal in the unmodulated state for a predetermined period of time following the wireless communication reader establishing a communication session with a wireless target.

In Example 38, the subject matter of Example 35, wherein the peak sampling means further comprises: a delay lock loop (DLL) means having an input coupled to an output of the phase estimating means and output coupled to a second input of the analog-to-digital converting means, for controlling the analog-to-digital converting means to sample the carrier signal in both the unmodulated and modulated states at the phase of the carrier signal in the unmodulated state.

In Example 39, the subject matter of Example 35, wherein the peak sampler further comprises: a resampling means having a first input coupled to the output of the analog-to-digital converting means, a second input coupled to an output of the phase estimating means, and an output coupled to an input of the phase estimating means, and configured to interpolate the samples of the carrier signal to sample the carrier signal in the unmodulated state at the peaks.

In Example 40, the subject matter of Example 39, wherein the peak sampling means further comprises: a decimating means having an input coupled to the output of the resampling means, for reducing the sampling rate of the carrier signal.

In Example 41, the subject matter of Example 34, wherein the envelope building means comprises: a delay means having an input coupled to the output of the peak sampling means, and configured to delay samples of the carrier signal; and an adding means having a positive input coupled to the output of the peak sampling means and a negative input coupled to an output of the delay means, for subtracting the delayed samples of the carrier signal from non-delayed samples of the carrier signal.

In Example 42, the subject matter of Example 41, wherein the envelope building means further comprises: a decimating means having an input coupled to an output of the adding means, for reducing the sampling rate of the carrier signal.

In Example 43, the subject matter of Example 34, wherein the wireless communication reader is a Near Field Communication (NFC) reader.

In Example 44, the subject matter of Example 34, wherein the carrier signal in the modulated state is Amplitude Shift Keying (ASK) modulated.

Example 45 is a wireless communication system, comprising: the wireless communication reader comprising the demodulator of the subject matter of Example 34; and at least one wireless target configured to communicate with the wireless communication reader by modulating the carrier signal with data.

In Example 46, the subject matter of Example 45, wherein the wireless communication system is a Near Field Communication (NFC) system.

Example 47 is a demodulator in a wireless communication reader, comprising: an offset estimating means for estimating in-phase and quadrature components offsets of a carrier signal in an unmodulated state to determine in-phase and quadrature component offsets; a load modulated signal estimating means for estimating in-phase and quadrature components of a load modulated signal by removing the in-phase and quadrature component offsets from in-phase and quadrature component samples of the carrier signal; and an envelope building means, coupled to the output of the load modulated signal estimating means, for building an envelope signal by combining the in-phase and quadrature components of the load modulated signal.

In Example 48, the subject matter of Example 47, wherein the offset estimator comprises: an in-phase offset estimating means for estimating the in-phase component offset of the carrier signal in the unmodulated state; and a quadrature offset estimating means for estimating the quadrature component offset of the carrier signal in the unmodulated state.

In Example 49, the subject matter of Example 48, wherein the in-phase offset estimating means is further for averaging in-phase component samples of the carrier signal in the unmodulated state, and wherein the quadrature offset estimating means is further for averaging quadrature component samples of the carrier signal in the unmodulated state.

In Example 50, the subject matter of Example 47, wherein the load modulated signal estimator comprises: an in-phase component load modulated signal estimating means for removing the in-phase component offset of the carrier signal in the unmodulated state from the in-phase component samples of the carrier signal; and a quadrature component load modulated signal estimating means for removing the quadrature component offset of the carrier signal in the unmodulated state from the quadrature component samples of the carrier signal.

In Example 51, the subject matter of Example 47, wherein the offset estimating means is for estimating the in-phase and quadrature component offsets of the carrier signal in the unmodulated state for a predetermined period of time.

In Example 52, the subject matter of Example 51, wherein the offset estimating means is for estimating the in-phase and quadrature component offsets of the carrier signal in the unmodulated state for a predetermined period of time following the wireless communication reader establishing a communication session with a wireless tag.

Example 53 is a wireless communication system, comprising: the wireless communication reader comprising the demodulator of the subject matter of Example 47; and at least one wireless tag configured to communication with the wireless communication reader by modulating the carrier signal with data.

Example 54 is an apparatus substantially as shown and described.

Example 55 is a method substantially as shown and described.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A demodulator of a wireless communication reader, comprising:
    a peak sampler configured to sample a carrier signal in an unmodulated state at peaks, and to sample the carrier signal in a modulated state at a phase of the unmodulated state; and
    an envelope builder having an input coupled to an output of the peak sampler, and configured to determine an envelope signal based on differentials between maximum and minimum peaks of respective cycles of the sampled carrier signal.

2. The demodulator of claim 1, wherein the peak sampler comprises:
    an analog-to-digital converter having an input configured to receive the carrier signal; and
    a phase estimator having an input coupled to an output of an analog-to-digital converter, and configured to estimate the phase of the carrier signal in the unmodulated state.

3. The demodulator of claim 2, wherein the phase estimator is configured to estimate the phase of the carrier signal in the unmodulated state for a predetermined period of time.

4. The demodulator of claim 3, wherein the phase estimator is configured to estimate the phase of the carrier signal in the unmodulated state for a predetermined period of time following the wireless communication reader establishing a communication session with a wireless target.

5. The demodulator of claim 2, wherein the peak sampler further comprises:
    a delay lock loop (DLL) having an input coupled to an output of the phase estimator and output coupled to a second input of the analog-to-digital converter, and configured to control the analog-to-digital converter to sample the carrier signal in both the unmodulated and modulated states at the phase of the carrier signal in the unmodulated state.

6. The demodulator of claim 2, wherein the peak sampler further comprises:
    a resampler having a first input coupled to the output of the analog-to-digital converter, a second input coupled to an output of the phase estimator, and an output coupled to an input of the phase estimator, and configured to interpolate the samples of the carrier signal to sample the carrier signal in the unmodulated state at the peaks.

7. The demodulator of claim 6, wherein the peak sampler further comprises:
    a decimator having an input coupled to the output of the resampler, and configured to reduce the sampling rate of the carrier signal.

8. The demodulator of claim 1, wherein the envelope builder comprises:
    a delay having an input coupled to the output of the peak sampler, and configured to delay samples of the carrier signal; and
    an adder having a positive input coupled to the output of the peak sampler and a negative input coupled to an output of the delay, and configured to subtract the delayed samples of the carrier signal from non-delayed samples of the carrier signal.

9. The demodulator of claim 8, wherein the envelope builder further comprises:
a decimator having an input coupled to an output of the adder, and configured to reduce the sampling rate of the carrier signal.

10. The demodulator of claim 1, wherein the wireless communication reader is a Near Field Communication (NFC) reader.

11. The demodulator of claim 1, wherein the carrier signal in the modulated state is Amplitude Shift Keying (ASK) modulated.

12. A wireless communication system, comprising:
the wireless communication reader comprising the demodulator of claim 1; and
at least one wireless target configured to communicate with the wireless communication reader by modulating the carrier signal with data.

13. The wireless communication system of claim 12, wherein the wireless communication system is a Near Field Communication (NFC) system.

14. A method for demodulating in a wireless communication reader, comprising:
sampling, by a peak sampler, a carrier signal in an unmodulated state at peaks, and the carrier signal in a modulated state at a phase of the unmodulated state; and
determining, by an envelope builder, an envelope signal based on differentials between maximum and minimum peaks of respective cycles of the sampled carrier signal.

15. The method of claim 14, further comprising:
estimating, by a phase estimator, the phase of the carrier signal in the unmodulated state.

16. The method of claim 15, further comprising:
controlling, by a delay lock loop (DLL), an analog-to-digital converter to sample the carrier signal in both the unmodulated and modulated states at the phase of the carrier signal in the unmodulated state.

17. The method of claim 15, further comprising:
interpolating, by a resampler, samples of the carrier signal to sample the carrier signal in an unmodulated state at the peaks.

18. The method of claim 17, further comprising:
decimating, by a decimator, the sampling rate of the interpolated carrier signal.

19. The method of claim 14, further comprising:
estimating, by the phase estimator, the phase of the carrier signal in the unmodulated state for a predetermined period of time.

20. The method of claim 19, further comprising:
estimating, by the phase estimator, the phase of the carrier signal in the unmodulated state for a predetermined period of time following the wireless communication reader establishing a communication session with a wireless target.

21. The method of claim 14, further comprising:
delaying, by a delay, samples of the carrier signal; and
subtracting, by an adder, the delayed samples of the carrier signal from non-delayed samples of the carrier signal.

22. The method of claim 21, further comprising:
decimating, by a decimator, the sampling rate of the carrier signal.

23. A demodulator in a wireless communication reader, comprising:

an offset estimator configured to estimate in-phase and quadrature components offsets of a carrier signal in an unmodulated state to determine in-phase and quadrature component offsets;
a load modulated signal estimator configured to estimate in-phase and quadrature components of a load modulated signal by removing the in-phase and quadrature component offsets from in-phase and quadrature component samples of the carrier signal; and
an envelope builder, coupled to the output of the load modulated signal estimator, and configured to build an envelope signal by combining the in-phase and quadrature components of the load modulated signal.

24. The demodulator of claim 23, wherein the offset estimator comprises:
an in-phase offset estimator configured to estimate the in-phase component offset of the carrier signal in the unmodulated state; and
a quadrature offset estimator configured to estimate the quadrature component offset of the carrier signal in the unmodulated state.

25. The demodulator of claim 24,
wherein the in-phase offset estimator is further configured to average in-phase component samples of the carrier signal in the unmodulated state, and
wherein the quadrature offset estimator is further configured to average quadrature component samples of the carrier signal in the unmodulated state.

26. The demodulator of claim 23, wherein the load modulated signal estimator comprises:
an in-phase component load modulated signal estimator configured to remove the in-phase component offset of the carrier signal in the unmodulated state from the in-phase component samples of the carrier signal; and
a quadrature component load modulated signal estimator configured to remove the quadrature component offset of the carrier signal in the unmodulated state from the quadrature component samples of the carrier signal.

27. The demodulator of claim 23, wherein the offset estimator is configured to estimate the in-phase and quadrature component offsets of the carrier signal in the unmodulated state for a predetermined period of time.

28. The demodulator of claim 27, wherein the offset estimator is configured to estimate the in-phase and quadrature component offsets of the carrier signal in the unmodulated state for a predetermined period of time following the wireless communication reader establishing a communication session with a wireless tag.

29. A wireless communication system, comprising:
the wireless communication reader comprising the demodulator of claim 23; and
at least one wireless tag configured to communication with the wireless communication reader by modulating the carrier signal with data.

30. A method for demodulating in a wireless communication reader, comprising:
estimating, by an offset estimator, in-phase and quadrature component offsets of a carrier signal in an unmodulated state to determine in-phase and quadrature component offsets;
estimating, by a load modulated signal estimator, an in-phase and quadrature components of a load modulated signal by removing the in-phase and quadrature component offsets from in-phase and quadrature component samples of the carrier signal; and building, by an envelope builder, an envelope signal by combining absolute values of the in-phase and quadrature components of the load modulated signal.

31. The method of claim 30, wherein the offset estimating step comprises:
averaging in-phase component samples of the carrier signal in the unmodulated state, and
averaging quadrature component samples of the carrier signal in the unmodulated state.

32. The method of claim 30, wherein the offset estimating step is performed for a predetermined period of time.

33. The method of claim 32, wherein the offset estimating step is performed for a predetermined period of time following the wireless communication reader establishing a communication session with a wireless tag.

* * * * *